United States Patent
Grund

(10) Patent No.: US 8,278,936 B2
(45) Date of Patent: Oct. 2, 2012

(54) TEST CIRCUITS AND CURRENT PULSE GENERATOR FOR SIMULATING AN ELECTROSTATIC DISCHARGE

(76) Inventor: Evan Grund, San Jose, CA (US)

( * ) Notice: Subject to any disclaimer, the term of this patent is extended or adjusted under 35 U.S.C. 154(b) by 458 days.

(21) Appl. No.: 12/274,365

(22) Filed: Nov. 20, 2008

(65) Prior Publication Data

US 2009/0134880 A1 May 28, 2009

Related U.S. Application Data

(60) Provisional application No. 61/003,908, filed on Nov. 23, 2007.

(51) Int. Cl.
*G01R 31/02* (2006.01)
(52) U.S. Cl. .............. 324/537; 324/762.01; 324/756.06
(58) Field of Classification Search .............. 324/76.11, 324/754.19, 756.06, 762.01, 537; 307/106
See application file for complete search history.

(56) References Cited

U.S. PATENT DOCUMENTS

| | | | | |
|---|---|---|---|---|
| 5,519,327 A * | 5/1996 | Consiglio | ............ | 324/678 |
| 6,307,363 B1 * | 10/2001 | Anderson | ............ | 324/72.5 |
| 6,429,674 B1 * | 8/2002 | Barth et al. | ............ | 324/762.01 |
| 7,119,597 B1 * | 10/2006 | Barrett et al. | ............ | 327/291 |
| 7,132,844 B2 * | 11/2006 | Hashimoto | ............ | 324/756.02 |
| 7,495,456 B2 * | 2/2009 | Horii et al. | ............ | 324/713 |
| 7,633,308 B1 * | 12/2009 | Sobolewski et al. | ............ | 324/126 |
| 2007/0296454 A1 * | 12/2007 | Koura | ............ | 324/771 |

* cited by examiner

*Primary Examiner* — Arleen M Vazquez
(74) *Attorney, Agent, or Firm* — Donald L. Bartels; Bartels Law Group

(57) ABSTRACT

This invention is an electrostatic discharge testing circuit that can deliver current pulses to a component under test (CUT) with a custom amplitude versus time profile shape. Pulse generation with customized shapes is accomplished by discharging an energy storage network comprised of capacitor(s), transmission line(s) and other passive components. Current pulses compliant to the European International Electrotechnical Commission IEC 61000-4-2 standard can be so produced. These current pulses are delivered to the CUT with low distortion through a constant impedance electrical path, such as a combination of cables and controlled impedance conductors of printed wiring boards compatible with packaged IC devices, assemblies, and wafer probes. The current pulses can be delivered with various impedances, and measurements made that allow the CUT currents and voltages to be calculated.

18 Claims, 8 Drawing Sheets

A preferred embodiment of the present invention with pulse current monitoring and 100 ohm pulse delivery impedance.

Figure 4a – Air discharges

Figure 4b – Contact discharges

Dimensions in millimetres.

Prior art IEC Test discharge gun tip definitions

Prior art IEC Test simplified diagram of the ESD generator

The IEC Test pulse definition from Figure 3 and Table 2 of the IEC 61000-4-2 specification Circuit diagram example of the present invention Current waveform from the present invention for an equivalent 8KV IEC Test pulse A preferred embodiment of the present invention with electrical testing at 50 ohm pulse delivery impedance A preferred embodiment of the present invention with pulse current monitoring and 100 ohm pulse delivery impedance.

A preferred embodiment of the present invention with 330 ohm pulse delivery impedance.

TEST CIRCUITS AND CURRENT PULSE GENERATOR FOR SIMULATING AN ELECTROSTATIC DISCHARGE

CROSS REFERENCE TO RELATED APPLICATION

This application claims the benefit of U.S. Provisional Application No. 61/003,908, filed Nov. 23, 2007, which is incorporated herein by reference.

BACKGROUND OF THE INVENTION

1. Field of the Invention

The present invention relates generally to electrical testing circuitry for integrated circuits (ICs) and in particular to apparatus for electrostatic discharge (ESD) sensitivity testing that includes a pulse generator (pulser).

2. Description of the Related Art

Testing of ICs for ESD sensitivity involves applying stress pulses simulating electrostatic discharges to an IC or device under test to determine robustness. The use of this stress testing is expanding to help ensure reliability of products such as computers and cell phones when they are exposed to ESD. Equipment that must operate in harsh and/or high static environments, such as automotive electronics, also requires thorough ESD reliability testing.

All electrical equipment sold in the European Community is required to conform to government safety regulations. Products in compliance with such safety regulations may be signified by the CE Mark. One of the many tests for CE Mark compliance is the ability to withstand electrostatic discharges to the surfaces of the product without damage. The International Electrotechnical Commission test method IEC 61000-4-2: Electromagnetic compatibility (EMC)—Part 4-2: Testing and Measurement Techniques—Electrostatic Discharge Immunity Test Ed. 1.2 b: 2001 is a standard that prescribes the ESD test method. It is a purpose of this invention to provide testing similar to this standard but with advantages not found in prior art methods for ESD testing of ICs.

The International Electrotechnical Commission IEC 61000-4-2 testing method, herein termed the IEC Test, defines a testing environment and a discharge gun pulse generator for ESD testing. This equipment and procedure is commonly used for testing a finished product, which is generally termed equipment under test (EUT). This testing method was designed only for testing complete systems, and is not directly applicable to testing of subassemblies, such as circuit boards, or of individual IC components or devices, often collectively termed a component under test (CUT). IC design and/or manufacturing companies have begun testing their products using variations of the IEC Test. The desire to test CUTs with the IEC Test is motivated by the assumption that when a product is assembled from parts that each individually pass the IEC Test, the completed product or EUT will pass the IEC Test.

Testing a CUT with tools and methods designed for an EUT is difficult. A primary reason for difficulty in applying the IEC Test to circuit boards or IC devices is the inability of the IEC Test specified ESD pulse generator to be connected to the typical IC device. The apparatus for ESD event simulation described in the IEC Test standard is a hand-held discharge gun with a large metallic probe tip. These gun tips are shown in FIG. 1. Such prior art ESD pulse generators using a metallic probe tip are difficult to connect to the small dimensions of today's microelectronic circuitry. Gun testing is especially difficult with high density packaging of modern ICs, which may have pin-to-pin spacing of 0.5 millimeters or less. Improper connection leads to pulse distortions that can adversely affect the testing results.

Connection from the IEC Test discharge gun to a CUT has been attempted in a variety of ways, and often with inconsistent results. The ground connection of IEC Test guns are not made with wide bandwidth cables so the return path may be high impedance at pulse frequencies depending on electrical coupling between CUT and the gun. IEC Test guns are known to generate unwanted electromagnetic (EM) radiation pulses in addition to the desired conducted current pulse. These unwanted EM radiation pulses complicate the testing environment, and EM pulse shielding is sometimes done to help mitigate the effect. EM pulse variations may be exacerbated by the placement of conductive surfaces in the testing environment such as the horizontal, vertical and ground coupling planes described in the IEC Test specification (these surfaces can provide a low impedance radio frequency (RF) grounds and reflections of the gun's EM pulse). Given these factors, a good deal of uncertainty can be introduced into IC test results when using IEC Testing discharge guns.

Prior art efforts to test CUTs to the IEC Test have focused on providing conductive paths from the discharge gun tip to one connection on the CUT and from another CUT connection to an earth connected ground plate so that the current produced by the pulse generator passes through the CUT. One prior art test method uses a test fixture board (TFB) to hold the CUT, either in a socket or by soldering the CUT directly to the TFB printed wiring, to make such connections. Electrical terminals, sometimes termed test points, are provided on a TFB that are compatible connections for the discharge gun tip. Printed wiring on the TFB conducts the discharge current from the gun's test point to the CUT and another electrical path for ground return current. This approach suffers from pulse shape distortion due to different electrical properties of the gun and the TFB. The gun is defined by the IEC Test specification to have 330 ohms of series resistance, as shown in FIG. 2. The wiring of TFBs can have impedances from about 30 to 150 ohms, but cannot be manufactured at 330 ohms due to physical printed wiring size limits. The mismatch of impedances will result in pulse reflections and waveform distortions to the fast current pulses. Such prior art testing also suffers from non-reproducibility due to TFB-to-TFB design variations in the conductive paths to the CUT. TFB wiring can act as an antenna picking up energy from the EM pulse, and any variations in the TFB wiring can change the EM pulse coupling from the gun to the TFB. Maintaining the proper waveform is required to simulate ESD events and meet the IEC Test requirements, and variations produce non-repeatable measurements.

Another prior art technique is to eliminate the intermediate conduction paths and antenna properties of the TFB by touching the gun tip directly to the CUT. With the miniature contacts on small microelectronic components, this can be very difficult. A prior art solution is to employ a robot that can position the discharge gun with accuracy that cannot be obtained from a human operator. However, since a complete electrical conduction path also requires a ground return, two connections must be made to the CUT. Even when more than one robot is used it can be impossible to make contacts to neighboring pins due to the size of the IEC Test gun's metallic tip. ESD testing requires specific characteristics from pulse generators to properly simulate an ESD event. Some pulse generators used for bench testing of electronic systems can generate arbitrary waveforms into 50-ohm coaxial cables. In theory, therefore, such pulse generators could generate the waveform that is needed for the IEC Test, and be an alternative to the hand-held gun. However, the IEC Test requires many amperes of current and hundreds, or even thousands, of volts to reach desired stress testing levels. These requirements for high power levels are far beyond the capabilities of common arbitrary waveform generators. A different type of pulse generator is needed for this application.

Prior art test methods lack the power, reproducibly and consistency in applying stress pulses to ICs or other devices that is needed for repeatability in testing. Therefore, there is a need for new equipment and methodologies to produce a repeatable and reliable test to evaluate the ESD sensitivity of ICs, devices, components and subassemblies with a test method similar to the EUT IEC Test but compatible with testing CUTs.

SUMMARY OF THE INVENTION

Electrostatic discharge (ESD) testing pulsers are characterized by an energy storage component, such as a capacitor, which is charged to a high voltage over a relatively long time period, and a switching device, such as a relay, that can isolate the storage component while it is being charged, and then connect the charged storage component to a conductive path to a component under test (CUT) whereby the stored energy is discharged into the CUT during a relatively short time period simulating an ESD event. The conductive path, which may include current limiting resistances, is important in producing the correct stress current waveform. The prior art ESD pulser, shown in FIG. 2, has a 150 pF capacitor storage element and a 330Ω resistor in the conductive path to the device under test or CUT.

The present invention employs multiple energy storage elements, combined with additional passive components that together will produce a desired waveform. The storage devices used in this invention are transmission lines combined with capacitors. Transmission lines can be synthesized by a sequence of inductors and capacitors, so this invention can be practiced with a combination of inductors and capacitors replacing a transmission line. The use of a single transmission line segment for energy storage would be recognized by those trained in the ESD testing art as being similar to a transmission line pulser (TLP) system. However, TLP systems are purposely designed to produce pulses of constant amplitude while the present invention produces a specific and non-constant amplitude current pulse. In particular, one application of this invention is to produce the current pulse waveform that is described in the IEC 61000-4-2 test specification (the IEC Test), which is diagrammed and summarized in FIG. 3.

In the present invention the current pulse shaping is largely accomplished by the energy storage network rather than the combined energy storage element and electrical path to the CUT. The energy storage in this invention is accomplished not by a single component such as used in prior art pulse generators, but a network comprised of two or more storage components, specifically transmission lines and capacitors, directly connected or connected with resistors. This invention can produce a wide variety of pulse shapes using specific combinations of storage components and resistors to generate the desired waveforms. A specific embodiment herein described is a set of components that will produce an IEC Test compliant current waveform.

One embodiment of the present invention includes a current pulse generator that produces ESD stress pulses and conducts these pulses to the CUT through 50-ohm coaxial cables. While this invention can be practiced with cables of impedance other than 50 ohms, this particular impedance is commonly used in the electronics industry, and therefore many 50-ohm connectors and conductors are available, making this impedance the preferred value. Herein the reference to "50-ohm" should be understood to be a convenient but not necessary impedance value as the invention can be practiced with transmission lines and cables of any impedance including cables of different impedances. Various means of pulse transmission can be employed to conduct the current pulse to the CUT instead of or in addition to cables. Herein the reference to "delivery cable" or "conduction path" should be understood to be encompassing all combinations of controlled impedance conduction paths including but not limited to cables, wire pairs, connectors, circuit boards with controlled impedances, relays, wafer probes, probe cards, sockets, and other components with approximately constant characteristic impedances that can be used alone or in combinations to provide the conductive path to the CUT.

An advantage of using controlled impedance delivery cables is that the current pulses are transmitted with little distortion, allowing fast pulse rise times to be delivered over a distance of several meters from the pulse generator to the CUT. Without the use of controlled impedances the parasitic wiring capacitances and/or inductances will attenuate the high frequencies of the current pulse causing the pulse to be modified as it is transmitted. Using delivery cables allows flexibility in applying ESD testing to a wide physical variety of CUT types.

CUTs, such as IC devices, can be in different physical forms, therefore, flexibility in connecting ESD testers to CUTs is an important feature of this invention. For example, if an IC is still in wafer form, as manufactured before being cut into individual dice, a wafer probing system featuring 50-ohm wafer probes may be used as a means of interfacing the pulse to the CUT. Wafer probes are also compatible with packaged CUTs and modules, as well as board assemblies and other component configurations.

In prior art ESD pulsers, the transmission path from the switching device to the CUT is often responsible for pulse shaping. It is not necessary, but possible to add shaping components compatible with 50-ohm cables forming the conduction path to the CUT of this invention. An example of this is a low pass filter that can be used to slow the generated pulse rise time. Another example is a 50-ohm signal attenuator that can be used to attenuate signals and reflections.

The production and delivery of current waveforms defined in the IEC Test specification is an application of the present invention. It is a purpose of this invention to remove problems of prior art IEC Test pulse generators. This invention makes improvements over prior art that will be described hereinafter, including: preventing strong EM pulses from impinging on the CUT and causing testing variations, generating pulses with high reproducibility, providing CUT current monitoring that can measure stress level and detect changes in CUT impedance, making testing easy due to integrated leakage measurement and automating test sequences and automatic report generation.

The stress level in the IEC Test specification is defined as a function of the pre-pulse voltage of a storage capacitor. However, the controlling waveform parameters of the IEC test are specified as currents from a discharge gun into a low impedance test load. Therefore, the pulses produced by the present invention will be herein described in terms of current waveform parameters, which can be related to IEC gun charge voltages as listed in FIG. 3. The IEC Test defines a current pulse waveform specified by four parameters: pulse rise time between 0.7 and 1.0 ns, peak current of 3.75 A per kV±10% (usually within 2 ns of the beginning of the pulse), current at 30 ns from the beginning of the pulse of 2 A±30% per kV, and current at 60 ns from the beginning of the pulse of 1 A±30% per kV, where kV is the IEC gun circuit storage element pre-pulse voltage in kilovolts. Current pulses compliant to the IEC specification should be generated at stress levels of up to at least 30 amperes peak current, which corresponds to an IEC Test gun pre-pulse charge voltage of 8 kV. According to Ohm's Law, the voltage of 30 A pulses is 1,500 volts when transmitted in a 50-ohm cable. This is a peak power of 45,000 watts according to Joules' Law. Therefore, it is a purpose of the present invention to provide high power pulses to this level.

This invention is an ESD test system that forces a current pulse through the CUT. An application of the present invention is a pulser with output current pulses as described in the IEC Test that is compatible with coaxial cable delivery for ESD testing. This is different than the prior art IEC Test pulse generator, which is a hand-held discharge gun that sparks to or contacts directly to a surface of the EUT from its metallic tip. These metallic gun tips (FIG. 1) are not compatible with constant impedance coaxial cable for mechanical and electrical reasons. Mechanically, the hand held gun discharge tip can make connection with some connectors but requires user skill and contact can be intermittent and therefore not always reproducible. Electrically, there is an impedance mismatch between the gun tip and a conductive path of a TFB. The gun has an impedance of approximately 330 ohms due to the output path resistor of the IEC Test specification (see FIG. 2). Printed wiring board conductors have typical impedance ranging from 40 to 120 ohms. Cables are commonly available from 50 to 93 ohms. Coaxial cables and printed wiring boards cannot be manufactured with an impedance matching the IEC Test discharge gun. The impedance mismatch between the gun tip and a test fixture or cable will generate repeated reflections that distort the stress pulse and significantly reduce the power of the stress pulse applied to the CUT. This problem can be avoided if the pulse generator has an output impedance equal to the cable and/or circuit board used for a TFB. Furthermore, using a commonly available impedance, such as 50 ohms, allows the stress pulse to be conducted by a combination of cables and printed wiring boards connected in series. Since the IEC test specification prescribes 330 ohms series resistance for the hand-held gun, there could be testing differences between a current pulse delivered by the gun and a pulse delivered through lower impedance cables. Therefore, it is an additional purpose of this invention to provide a system test environment that is of higher impedances than are obtained by individual cables or printed wiring on circuit boards alone. This is accomplished by adding series resistance close to the CUT in its ground return current path.

Since the IEC Test is defined by a current waveform generated from a 150 pF storage capacitor, and the present invention uses different storage elements, the charging voltage will be different for the same stress current. To verify the stress level, it is useful to monitor the current that passes through the CUT, and therefore it is a purpose of the present invention to provide current pulse waveform measurement of the stress pulse applied to the CUT. In an embodiment of the present invention, the current return path is provided by an additional controlled impedance cable with radio frequency (RF) attenuators and an oscilloscope that can monitor the current pulse amplitude and waveform shape. In yet another embodiment, the current return path is made to have a resistance that when combined with the other system resistances will match the delivery resistance of prior art discharge guns.

The current that passes through the CUT is determined not only by the generated current pulse, but also the resistance of the CUT. When the current stress pulse reaches a level that does physical damage to the CUT, the resistance of the CUT may change. With current waveform analysis, it is possible to determine a change in CUT resistance and thereby detect the stress level that induces failure for some types of CUTs.

ESD testing is usually accomplished by the application of pulses of increasing stress until the CUT sustains physical damage from the ESD stress pulse. Those skilled in ESD testing will understand that control and reproducibility of applied stress pulses is important to such testing. The highest level of stress before damage is typically the reported testing results. Therefore, it is a further purpose of the present invention to provide repeatable and reproducible stress pulses of predefined magnitudes. Control of the high voltage supply will determine the pre-charge voltage of the storage network and the pulse current levels. Such voltage control to produce a sequence of stress pulses is typically done by computer control in ESD testing systems.

In order to determine when physical damage is sustained, electrical test instruments are sometimes connected to the CUT and functional or parametric testing is performed after stress pulse application. Equipment, such as a source-meter unit, can make CUT leakage measurements or curve traces between pulses to determine the failure level. Device failure is determined by changes in its electrical characteristics, such as leakage or curve traces, due to application of the ESD simulating stress pulse or pulses. Another feature of this invention is electrical switching between stress pulsing and electrical testing. The can be accomplished by adding a 50-ohm switch or relay to the delivery cable so the test equipment can be connected to the CUT by such a switch or relay. This is more convenient than a prior art gun discharge where leakage measurement equipment must be connected and disconnected manually between each pulse discharge. A further improvement over prior art is the automation of this electrical path switching and automatic coordination of a testing sequence allowing automatic stress of increasing levels, damage data collection and report generation by computer.

The IEC Test describes a testing table with horizontal and vertical metallic coupling planes upon which the equipment under test (EUT) is placed. Waveform variations with the IEC Test discharge gun are observed in different testing environments due to the gun's EM pulse that interacts with such coupling planes. An EM pulse is generated from the rapid change in current that occurs in an ESD simulator during pulse generation. Some prior art gun pulse generators purposely produce additional EM pulse radiation as part of their waveform shaping methods. A purpose of the delivery cable is to allow separation between the pulse source that will generate an EM pulse, and the CUT. The distance of separation can be large enough to effectively attenuate the generated EM pulse to a negligible level. EM pulses are attenuated by the square of the distance between the pulse source and CUT. Adding a meter of cable can reduce the EM pulse to only 3% of the strength from a gun discharge. It is a purpose of the present invention to not require special testing environments such as metallic covered tables or coupling planes.

BRIEF DESCRIPTION OF THE DRAWINGS

The present invention can be better understood with reference to the accompanying drawings, which are incorporated in and form a part of this specification, and, together with the description, serve to explain the principles of the present invention.

DETAILED DESCRIPTION OF THE PREFERRED EMBODIMENTS

In the following description, numerous specific details are provided, such as the identification of various system components, to provide a thorough understanding of embodiments of the invention. One skilled in the art will recognize, however, that the invention can be practiced without one or more of the specific details, or with other methods, components, materials, etc. In still other instances, well-known structures, materials, or operations are not shown or described in detail to avoid obscuring aspects of various embodiments of the invention. Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
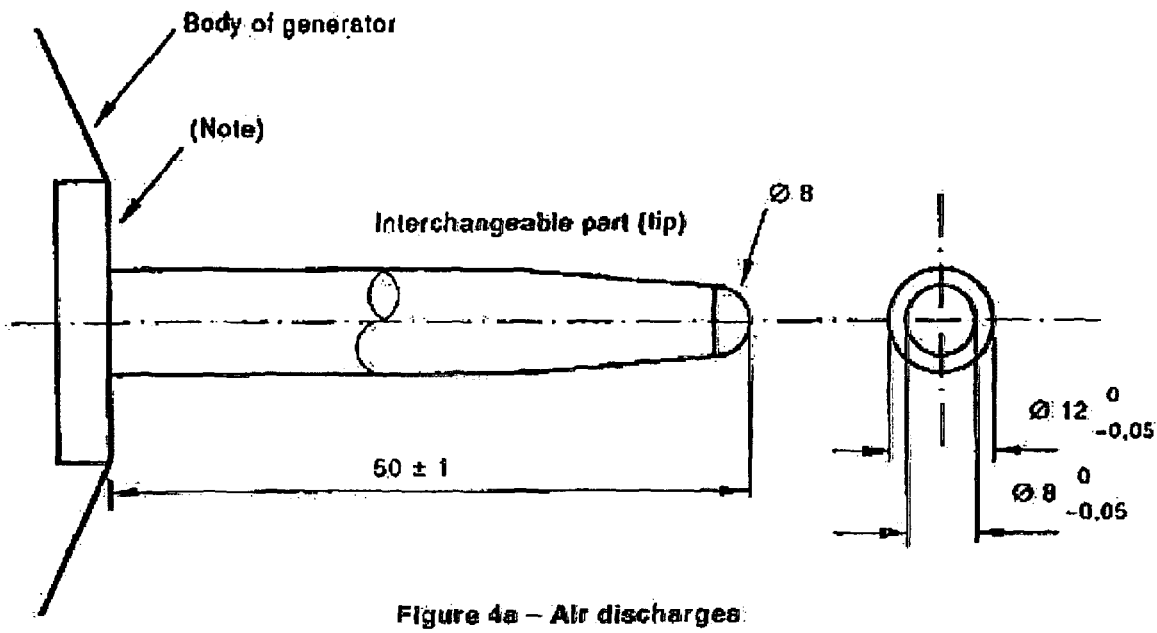
FIG. 1 is a drawing of the prior art IEC Test discharge gun tips.
Figure 1:
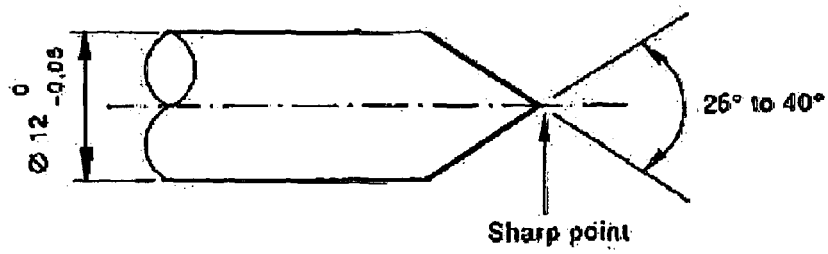
Figure 2:
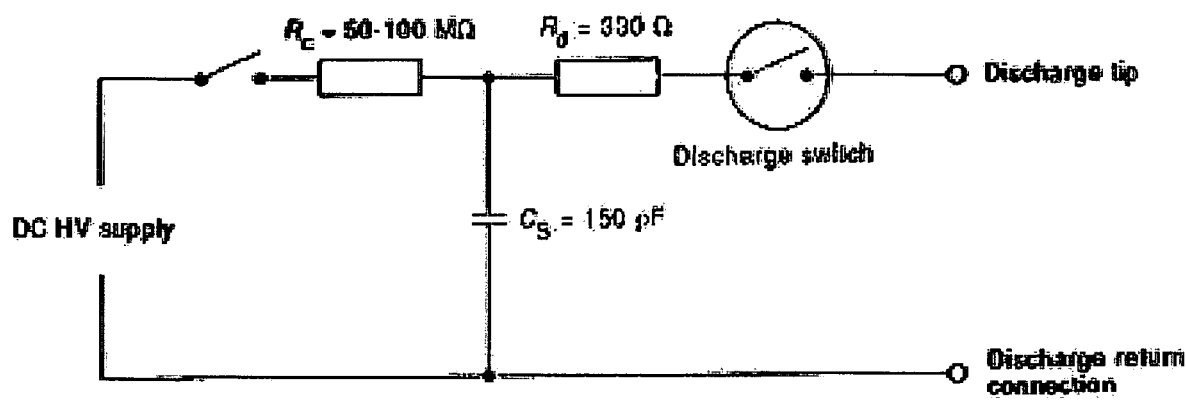
FIG. 2 is a prior art circuit diagram of the IEC Test ESD generator.
Figure 3:
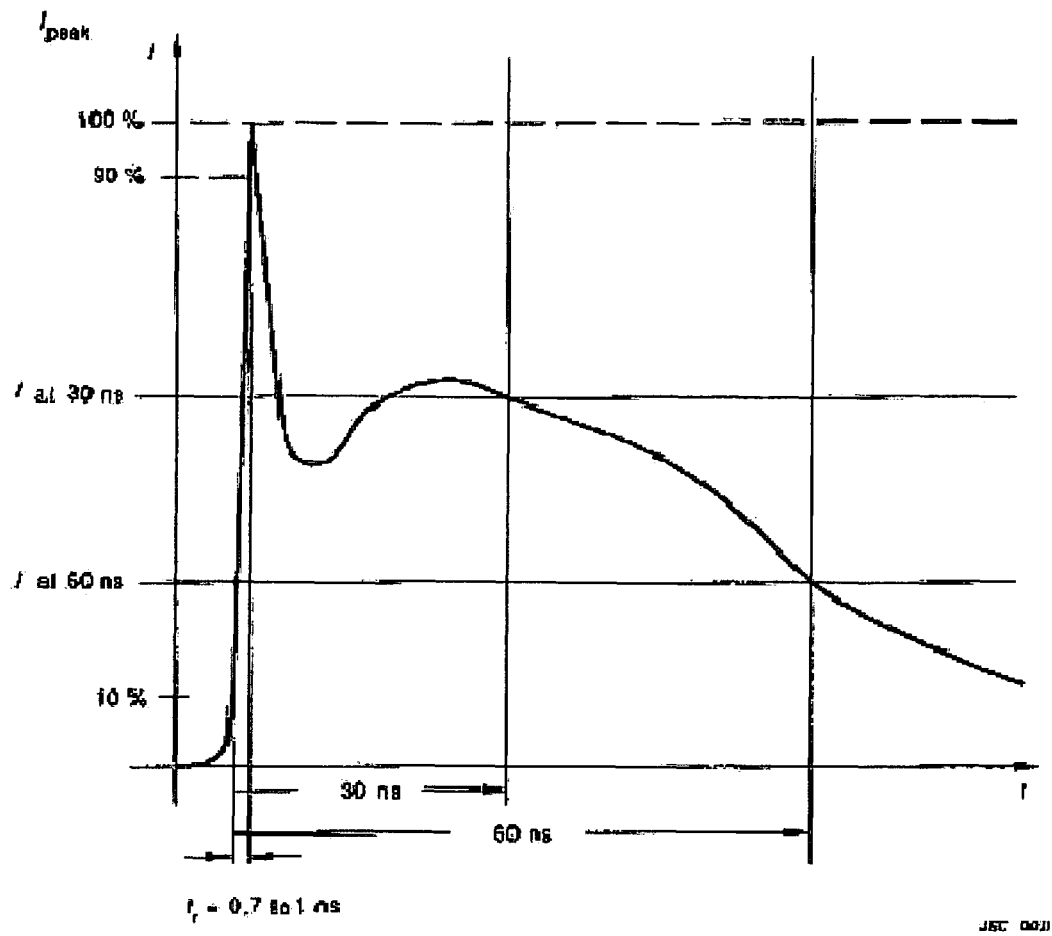
FIG. 3 is the IEC Test pulse current waveform definition shown graphically and in a parameter table.
Figure 4:
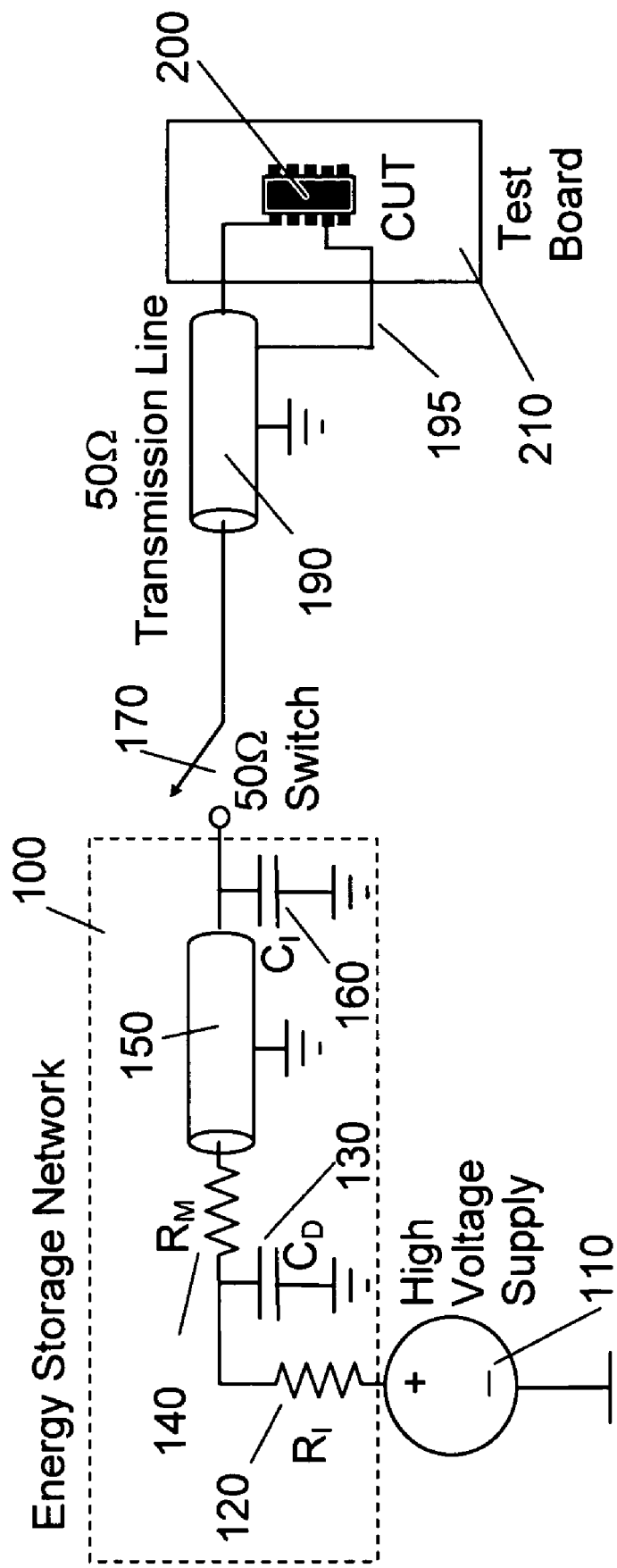
FIG. 4 is a circuit diagram example of the present invention.
Figure 5:
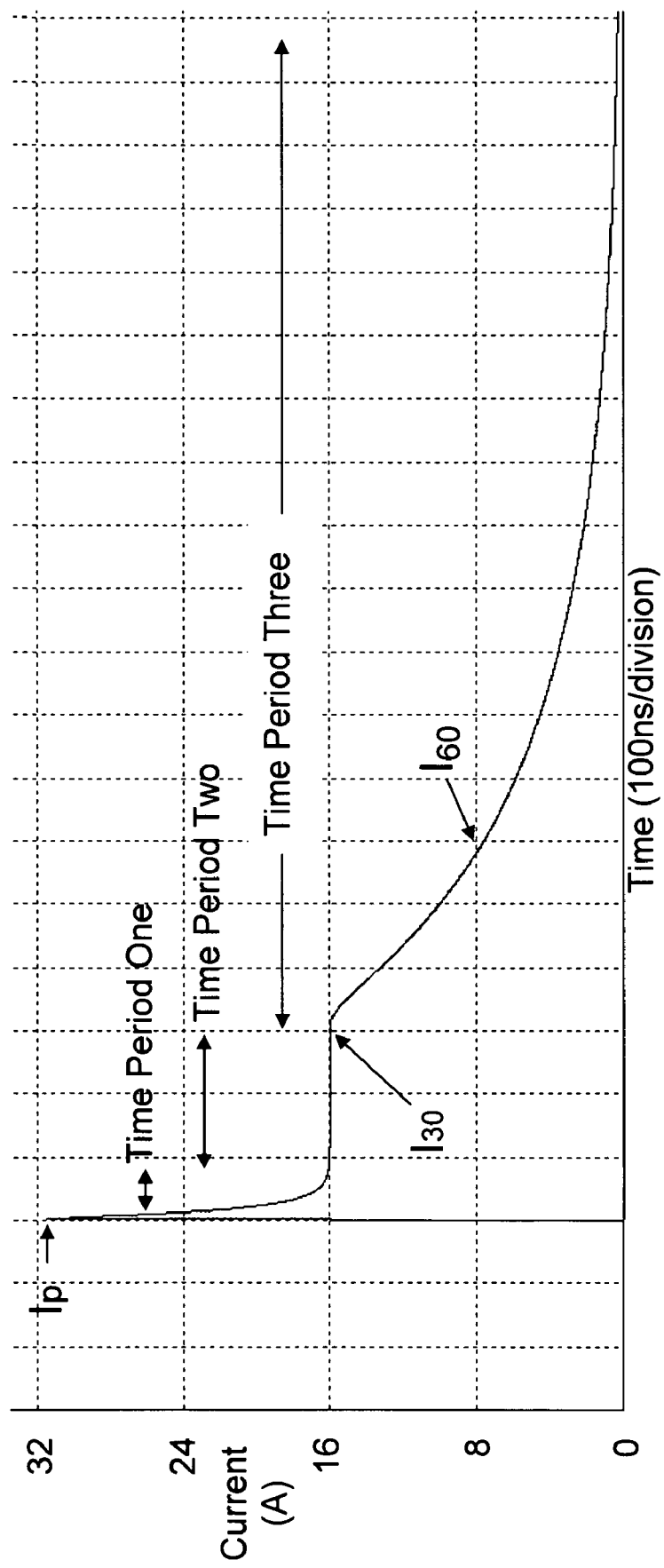
FIG. 5 is a drawing of the current waveform from the present invention.

In one embodiment of the present invention a current pulse is generated by pre-charging a network that includes energy storage elements and subsequently discharging this network by relay closure into a controlled impedance delivery cable that conducts the stress pulse to the CUT. In general, the energy storage network is composed of one or more transmission lines plus, one or more capacitors, and optionally one or more resistors. FIG. 4 is an example of the technique of this invention. In this embodiment one transmission line and two capacitors are the energy storage elements and two resistors control the charging and discharging rates. This ensemble will generate the desired waveform, FIG. 5, which has three distinct current pulse sections, each covering a specific time period, in order to meet the IEC Test waveform requirements as defined the IEC 61000-4-2 specification. It will be understood by those trained in the art of pulser designs that other waveforms can be generated using this invention. A coaxial cable provides the current pulse delivery and also the current return path. The system diagrammed in FIG. 4 produces the waveform shown in FIG. 5, which satisfies the IEC current pulse waveform and its defining parameters shown in FIG. 3.

Referring to FIG. 4, the operation of this pulser begins when the high voltage power supply 110 charges the energy storage network 100 while the 50-ohm switch 170 is open. In this preferred embodiment the energy storage network 100 is composed of a current limiting resistor 120 with resistance $R_1$, a decaying waveform capacitor 130 of capacitance $C_D$, a transmission-line-matching resistor 140 of resistance $R_M$, a transmission line 150, and an initial spike generating capacitor 160 of capacitance $C_1$. When switch 170 is closed the energy stored in 100 is transmitted to the pulse delivery cable 190 to the CUT 200. When the switch 170 is subsequently opened the storage network is again recharged.

Resistor 120 is of a relatively large resistance $R_1$, such as 100 kΩ to 10 MΩ, to provide a slow charging of the storage network. During the short pulse discharge time period the resistor 120 will not transfer significant current from the high voltage power supply due to its large resistance value so it also provides isolation. In FIG. 4 resistor 120 is shown connected to storage capacitor 130, however, it could also be connected to either end of transmission line 150. In practicing this invention the exact connection point of the resistor 120 is not critical. The charge can be delivered to any ungrounded point in the storage network, providing flexibility of the storage network input. Alternately, the high voltage supply 110 can be connected through a switch or relay in addition to or in place of resistor 120 to provide increased isolation of the high voltage supply during the discharge. It should be understood that there are many equivalent ways to charge the storage network by various connections to a high voltage supply as will be know to those trained in electrical engineering.

The current pulse is produced when the 50-ohm switch 170 connects the charged storage network 100 to the conduction path constant impedance cable 190. The total delivery path is composed of the constant impedance conductors represented as cable 190, the test fixture board 210, and a ground return conductor 195. The constant impedance of these transmission components deliver the pulse to the CUT largely unchanged. The delivery cable 190 has a grounded outer conductor that provides the current return path from conductor 195 that completes the electrical circuit from the energy storage network 100 through the CUT 200.

Referring to the energy storage network 100, the transmission line segment 150 and storage capacitors 130 and 160 become initially charged by current from the high voltage supply 110 through the current limited resistor 120 while switch 170 is open. When switch 170 is closed, it connects 150 to 190, and the charge stored in both 150 and 160 begins to flow into 190 and then through the CUT 250. The components 130, 140, 150 and 160 of the storage network 100 produce three specific features of the current pulse waveform, as depicted in the three time periods of FIG. 5. The initial spike generating capacitor $C_1$ 160, along with the transmission line 150, produce the initial current spike that peaks with IEC waveform parameter $I_P$ during period one. The value of capacitor $C_1$ determines the decay time from $I_P$ to the plateau current. Period two is the current plateau from approximately 10 to 30 ns. The equation $$i(t) = I_{30} + (I_P - I_{30}) \cdot e^{-\frac{t}{\tau}}$$

for 1 ns<t<30 ns describes the decay from Ip to a plateau current level, called $I_{30}$, with the time constant $\tau = 25 \cdot C_1$ (where 25 is derived from the parallel impedance of two 50Ω components, the transmission line 150 and the switch 170). The initial current rise to $I_P$ and decay from $I_P$ to the plateau current $I_{30}$ defines the current waveform during time period one.

Current from storage elements 150 and 160 combine to produce the peak current, which is sent into the delivery cable 190. The current from transmission line 150 is $$i_{TL}(t) = \frac{Vo}{2Zo}$$

for $0<t<2t_L$ where Vo is the initial storage network output voltage, Zo is the common impedance of 150, 170 and 190, t=0 when the switch 170 closes, and $t_L$ is the end-to-end signal propagation time of the transmission line 150 (as determined by its length multiplied by its signal propagation velocity). In this preferred embodiment the transmission line is selected to have a length so that $t_L$ is approximately 15 ns in order to produce the current waveform of time periods one and two. During time period one, this $i_{TL}$ current is augmented by the current $$i_{C1}(t) = \frac{Vo}{2Z_0} e^{-\frac{2t}{C_1 Z_0}}$$

from capacitor 160 of value $C_1$. The peak current is set by the initial storage network voltage that is about 1.5 kV for equivalent current of an IEC Test 8 kV contact discharge. After time t', when $$e^{-\frac{2t'}{C_1 Z_0}}$$

becomes very small, which is about 10 ns for a 100 pF capacitor $C_1$, then $C_1$ no longer adds significant current to the output pulse. This defines the beginning of time period two.

Relatively constant current characterizes the waveform during time period two, which lasts from t=t' until $t=2t_L$. The current at t=30 ns is $$i_{TL}(30\text{ ns}) = \frac{Vo}{2Zo},$$

which defines the $I_{30}$ current. When $t>2t_L$, the current waveform is in time period three, where current output from the storage network is $$i_{CD}(t) = e^{-\frac{t-2t_L}{C_D(R_M+Z_0)}}$$

for $t>2t_L$ from the capacitor $C_D$ 130. Time period three is a decaying exponential set by the time constant of $C_D \cdot (R_M + Zo)$, where Zo is the impedance of transmission line 150, $C_D$ is the capacitance of capacitor 130 and $R_M$ is the resistance of resistor 140. The transmission line matching resistor 140 is selected to equal the impedance of the transmission line 150. This is required to produce a smooth current waveform transition from time period two to time period three. The value $C_D$ of capacitor 130 sets the decaying waveform's time constant during time period three, and is selected to have the correct current at 60 ns according to the IEC Test parameter definition. This decay reduces the current to approximately half the current in 30 ns (160 is one-half of 130 after 30 ns of decay).

For obtaining the current at 60 ns defined in the IEC Test, $$e^{-\frac{60\text{ns}-30\text{ns}}{C_D(R_M+Z_0)}} = 0.5 \text{ or } C_D = -\frac{30 \cdot 10^{-9}}{(R_M+Z_0) \cdot \ln(0.5)} \approx 400 \text{ pF}.$$

It should now be understood that the multi-element energy storage network is central to this invention. Energy stored in capacitors and transmission lines is delivered in time sequences as determined by transmission line lengths. By proper component selection, as exemplified above, the defined parameters of the current waveform of the IEC test can be produced. While it is a purpose of this embodiment that this particular waveform be produced, this invention is not limited to this waveform alone. With simple modification of the number of components, their connections and values, other waveforms can be produced.

Since this pulser is based on passive components it is a linear system, and pulse amplitude control is achieved by varying the high voltage supply output to produce a current pulse corresponding to any voltage of the IEC contact test method. Using computer control of the high voltage supply voltage and operation of switch 170, a sequence of increasing stress levels can be generated under software control.

Figure 6:
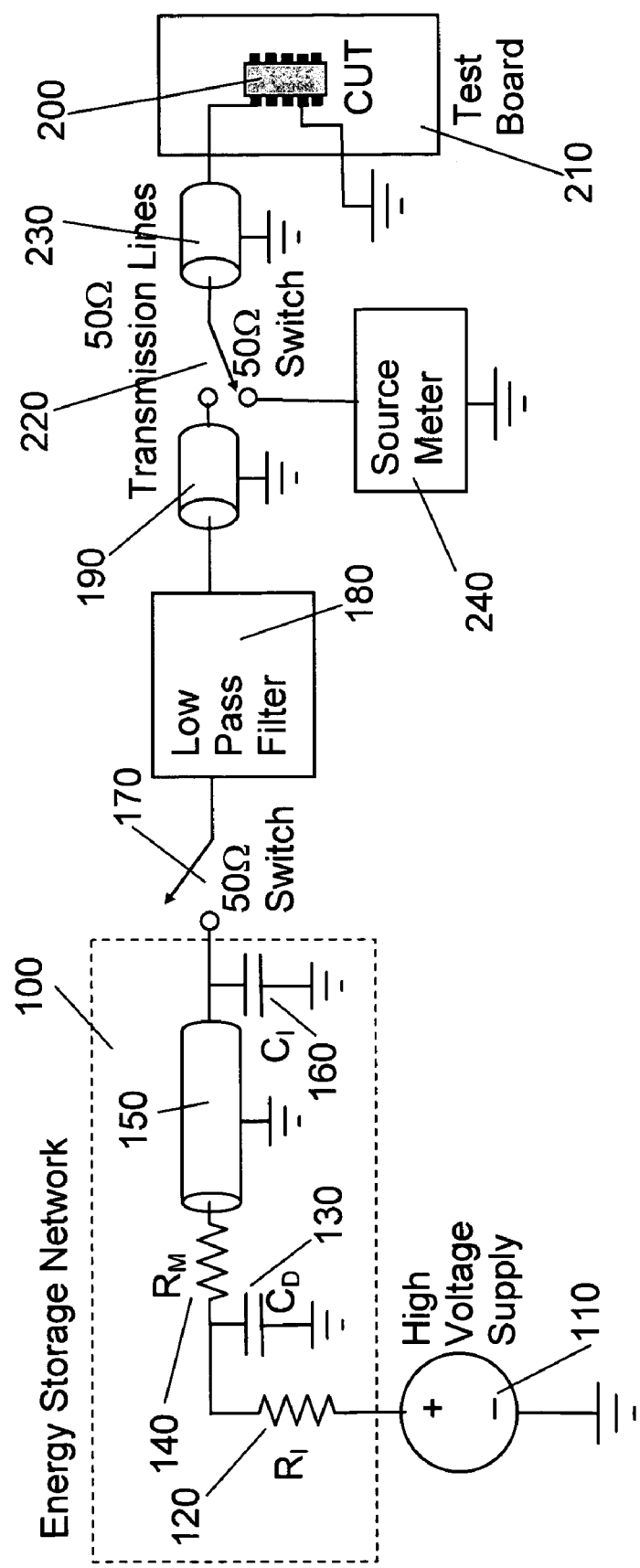
FIG. 6 is a preferred embodiment of the present invention with 50 ohm impedance at the CUT.

All transmission lines and cables used in the herein embodiments are 50Ω for convenience and compatibility with readily available components such as connectors, filters, attenuators and oscilloscopes. As shown in FIG. 6, a low pass filter 180 can be used to increase the initial current pulse rise time to the IEC Test parameter range of 0.7 to 1 ns if needed.

The conduction path 190 can be a combination of cables, connectors, and printed wiring boards, all with 50Ω impedance. Maintaining a 50-ohm transmission path with RF cables and connectors, and strip-line or microstrip printed wiring board construction, removes impedance variations that degrade pulse quality, which can reduce the peak current stress of the pulse. This transmission path may include a test fixture board (TFB). It is a purpose of this invention to allow the CUT 200 to be placed on a TFB 210. Such TFBs are common in the testing of radio frequency (RF) or microwave components. TFBs may be composed of connectors and conduction paths that can all be 50 ohm impedances, which allow the controlled impedance to extend uninterrupted from the pulser to the CUT. The ground return path on such TFBs may be a conductive trace or a plane that is commonly referred to as a ground plane. The electrical circuit for the current pulse is completed by connecting the ground return path 195 to the outer conductor, or shield, of the pulse delivery cable 190. This technique is also compatible with 50-ohm wafer probes that are commonly used for RF testing of IC wafers (the form of ICs before they are cut into individual dice).

In order to activate the switch 170, and to control the voltage of high voltage supply 110, and to coordinate similar activities that are needed for a complete test system, a control system such as a computer is needed. This computer is not shown in FIGS. 4, 6, 7 and 8 for clarity. However, as such controlling circuitry is required and is a common part of ESD testing systems, it should be understood as a part of this invention. A test plan can be executed by computer that would consist of a set of stress current levels, a number of pulses at each stress level, a time delay between pulses, and other testing parameters. The computer system would use this definition data to set the voltage of the high voltage supply 110, to activate the 50-ohm switch 170 and to control the other components as may be part of the testing system, often including a status display and test report printer.

Another preferred embodiment of the present invention is diagrammed in FIG. 6. This embodiment adds a low pass filter 180 in the 50-ohm pulse delivery path to the CUT 200. At high voltages, a spark discharge may occur within the 50-ohm switch 170 that can produce a current pulse rise time faster than 0.7 ns. This low pass filter 180 will remove unwanted high frequencies from the pulse. A low pass filter with a −3 dB high frequency cutoff of approximately f=0.35/tr, where tr is the desired minimum rise time, can be selected. In this embodiment, a 0.7 ns tr is made with a 500 MHz low pass filter.

The embodiment diagrammed in FIG. 6 also has a source-meter unit 240 that can test the electrical properties of the CUT 200. A 50Ω switch 220 and another section of transmission line 230 is added to the current pulse path. With the switch 220 in its inactive state the transmission path is unchanged from the previous embodiment description. When switch 220 is activated, the conductive path to CUT 200 is no longer connected to the pulse generator, but instead the CUT 200 is electrically connected to a source-meter unit (SMU) 240. It is a purpose of this invention to have the ability to switch from stress pulsing to electrical testing in order to determine if the applied stress has damaged the CUT. The use of an SMU is common in ESD testing, but the SMU is just an example of test equipment. Other test equipment can be used including, but not limited to, semiconductor parametric analyzers, curve tracers, vector volt meters, network analyzers, time domain reflectometers and automated test equipment. This list is not meant to be exhaustive nor limit the application of this invention to the equipment named.

Before the first stress pulse, the SMU 240 can measure current passing through the CUT under one or more applied voltages when the 50-ohm relay or switch 220 connects the SMU 240 to the CUT 200 through connecting cables 230 and test fixture board 210. After each stress pulse the measurement can be repeated for detection of electrical changes in the CUT by comparing the before and after data. Switches connecting the CUT to test equipment can be a single switch as shown in FIG. 7 or a matrix of switches connected to a multiplicity of CUT electrical connections.

Figure 7:
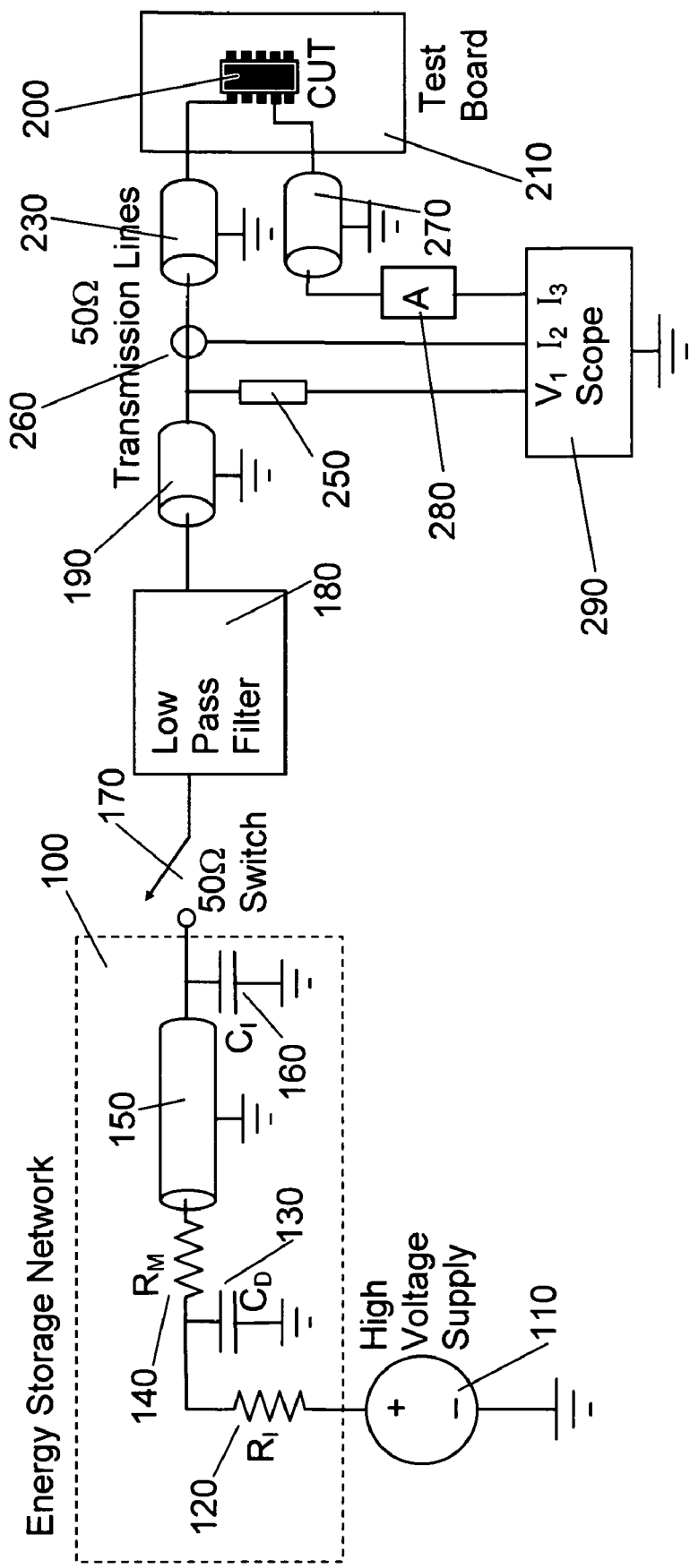
FIG. 7 is a preferred embodiment of the present invention with pulse current monitoring and 100 ohm impedance at the CUT.
Figure 8:
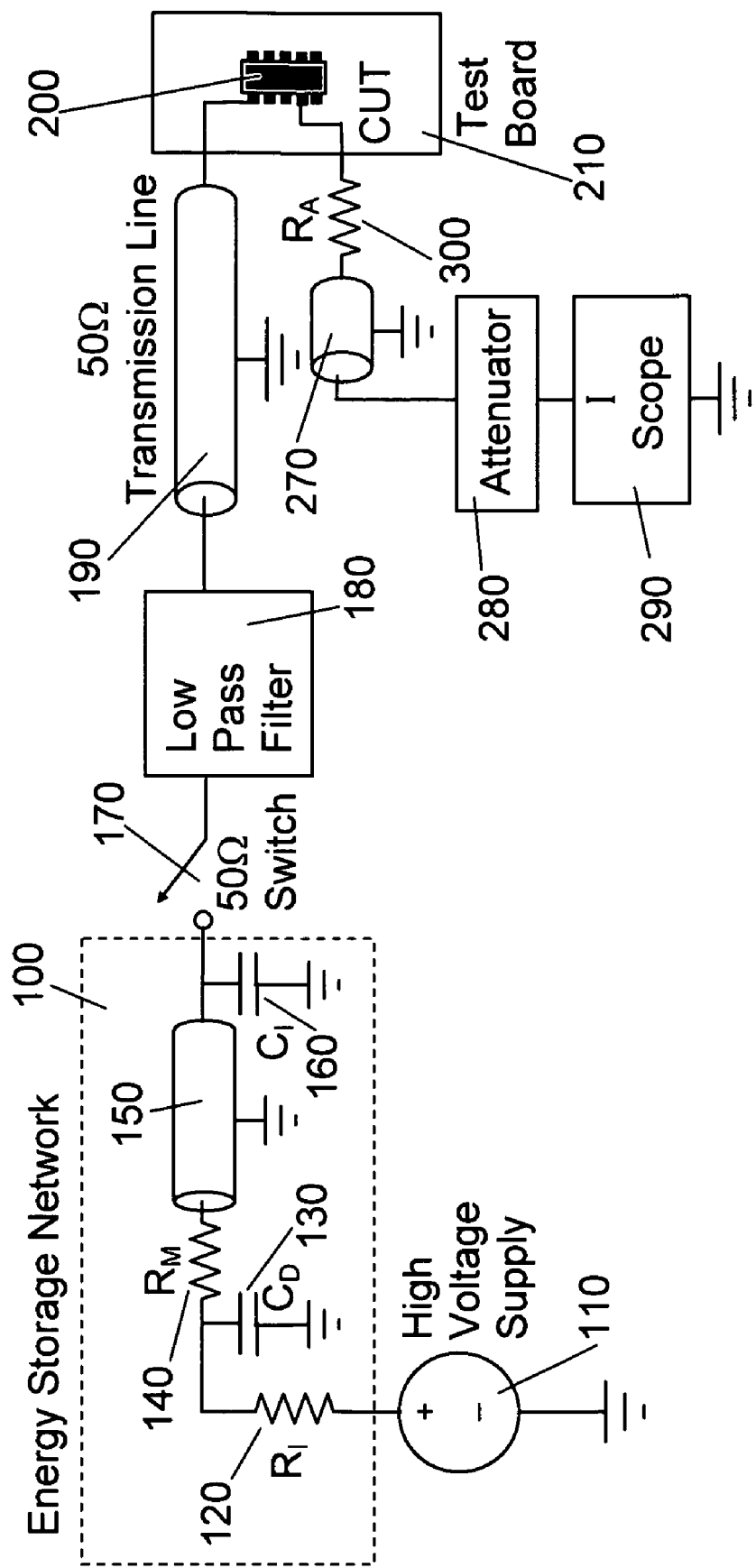
FIG. 8 is a preferred embodiment of the present invention with 330 ohm impedance at the CUT.

FIG. 7 shows another embodiment of the current invention that includes current pulse measurement by use of an oscilloscope (scope) 290. Electrical measurements of the current pulse traveling to the CUT 200 is made with voltage probe 250 and current probe 260 inserted into the delivery path. In order to insert such electrical probes the delivery cable is made in two sections 190 and 230 and the probes are connected to the signal conductor in the delivery path. Voltage probe 250 and/or current probe 260 may be commercial measurement probes, or other measurement transducers. The outputs of these transducers are connected the inputs of scope 290 to record the pulse waveforms. It should be noted that the recorded pulse signals can be distorted from the actual voltage and current pulses delivered to the CUT due to time separation between the generated pulse and reflections from the CUT. When the measurements are made very close to the CUT, these distortions are minimized. The current that passes through the CUT 200 can also be measured in the current return path. In FIG. 7 the return path of the current pulse is not connected to the delivery transmission line outer conductor shield as in previously described embodiments, but is connected to another transmission line cable 270. All current flowing through the CUT 200 is forced to also flow through the center conductor of cable 270. This current pulse is reduced to a level that can be measured by scope 290 using signal attenuator 280. The purpose of attenuator 280 is to reduce the current pulse level to a range that can be delivered to the scope without damage to the scope's 50-ohm input. The required signal attenuation may require a series of discrete attenuators to be used. One or more of the three scope signals of FIG. 7 may be used in implementing this invention while the signal labeled 13 is the preferred current signal because it is a direct measurement of the pulse. Measurement of the voltage across the CUT can be done by measuring the voltage at both ends of the CUT and calculating the difference.

Except for the unusual case where the CUT has the same impedance as the pulse delivery cable, not all the energy of the pulse will be absorbed by the CUT. The unabsorbed energy will be reflected. Reflections will travel back over the transmission path to the storage network and may cause a re-reflection which will distort the pulse. Attenuators can is inserted into the delivery path which will reduce a significant portion of these unwanted reflections, but will also reduce the power of the original current pulse. An improved method of reducing reflections is to add a terminating resistance between the CUT and the ground return of the delivery path. Most components that will be tested will exhibit a low resistance when conducting the large current pulse, for if this was not the case then the large heating power (equal to the current squared times the resistance) will overheat the CUT and induce destruction. If we add a resistor of resistance approximately equal to the impedance of the delivery cable, then the sum of the CUT impedance and this new resistance will approximate a matched load to the delivery cable, and not produce a significant reflection.

Implied in FIG. 7 is a control system, such as a computer, which is not shown for clarity, but that can coordinate the current pulsing (activation of switch 170) with the waveform recording of scope 290. The computer or control system could also gather data from scope 290 and use such data to generate test reports. The recording of the actual current pulse waveform delivered to the CUT is an advantage over prior art ESD test systems as the exact stress applied to the CUT can be determined.

The prior art discharge gun has a 330Ω resistance in its delivery path. The embodiments of the present invention previously described have 50Ω impedance or 100Ω impedance (when two cables connect to the CUT). The result of the different impedances is that the current flowing through the CUT can be different in the test methods of this invention compared to the current from the discharge gun for the same pre-charge voltage. To correct this possible problem, a resistor may be inserted in the ground path of the CUT to increase the delivery impedance. This resistor could be placed on the TFB 210 or in the ground path 195 shown in FIG. 4. This test method controls the pulse delivery impedance seen at the CUT. In another preferred embodiment, shown in FIG. 8, resistor 300 is added to the current return path on the TFB 210 or at the end of the cable 270. The value of $R_A$ of resistor 300 is set approximately to 330−2Zo=230Ω in order to match the impedance of the IEC Test gun. It should be noted that the signal seen at the scope 290 will be reduced by 15 dB, or the factor of $$\frac{50}{R_A + Z_O},$$

due to the attenuation action of $R_A$, the 50Ω scope input, and cable 270 impedance Zo. Therefore, the required attenuation of attenuator 280 may be reduced accordingly from the previous embodiment.

What is claimed is:

1. A current pulse generator for coupling a current pulse to a component under test (CUT) having a plurality of electrical connections, comprising:
an energy storage network having input, output and ground connections and comprised of passive components that include at least two capacitors and at least one transmission line, wherein a first one of said capacitors is connected between said energy storage network output connection and said energy storage network ground, and wherein the second one of said capacitors has first and second terminals with the first terminal connected to said energy storage network ground connection, and wherein said transmission line has first and second terminals, with said first terminal connected to said energy storage network output connection and said second terminal coupled to said energy storage input connection and to the second terminal of said second one of said capacitors;
a power source for generating a voltage signal operatively connected to said energy storage network input;
an electrical conduction path comprising signal and ground conductors each having first and second ends and wherein the first end of the ground conductor is connected to said energy storage network ground, and the signal and ground conductors each sized to enable their second ends to be connected to one or more of said CUT electrical connections; and
a switch having an open position and a closed position and connected between said energy storage network output and the first end of the signal conductor of said electrical conduction path, said switch acting when in its open position to decouple said energy storage network from the signal conductor of said electrical conduction path, and acting when in its closed position to cause the energy stored in said energy storage network to discharge and transmit the current pulse to the signal conductor of said electrical conduction path whose shape is a function of the values of said passive components and the length of the transmission line.

2. The current pulse generator of claim 1, further comprising:
a controller to control said switch.

3. The current pulse generator of claim 1, wherein said electrical conduction path is comprised of a series of approximately constant impedance conductors, connectors and/or inserted components all of approximately the same impedance.

4. The current pulse generator of claim 3, wherein said series of approximately constant impedance conductors, connectors and inserted components all have an impedance of approximately 50 ohms.

5. The current pulse generator of claim 3, wherein said inserted components may be low pass filters, and/or relays, and/or electrical signal transducers, and/or current sensors, and/or voltage sensors, and/or attenuators, and/or wafer probes, and/or test fixture boards and/or sockets, or similar components.

6. The current pulse generator of claim 5, wherein said electrical signal transducers are connected to an electrical signal recorder.

7. The current pulse generator of claim 6, wherein said electrical signal recorder is an oscilloscope or analog-to-digital converter and computer.

8. The current pulse generator of claim 3, wherein at least one of said series of approximately constant impedance conductors is a printed wiring circuit board, that may include a socket, operable to mount and make electrical contacts with said CUT.

9. The current pulse generator of claim 1, wherein said switch comprises a first switch, and wherein said current pulse generator further comprises:
a second switch operable to selectively couple said voltage signal to said energy storage network input;
a controller operable to control said power source, said first switch, and said second switch in combination to perform the operations of:
i.) opening said first switch to substantially decouple said energy storage network from said electrical conduction path, and closing said second switch to cause said energy storage network to charge from said power source;
ii.) opening said second switch to substantially decouple said voltage signal from said energy storage network input and
closing said first switch.

10. The current pulse generator of claim 1, wherein said passive components are configured to deliver current pulses that increase and decrease in amplitude with time in a predetermined pattern upon closure of said switch.

11. The current pulse generator of claim 10, wherein, when said switch is closed, said energy storage network delivers a current pulse to said signal conductor having first, second, and third time periods, the current pulse in said first time period controlled by said first one of said capacitors and said transmission line to provide an initial current rise in amplitude to a first current value and a decay from this value to a lower plateau current amplitude, the current pulse in said second time period remaining substantially constant at said plateau current amplitude, and the current pulse in said third time period controlled by said second one of said capacitors and said transmission line to produce a decreasing current amplitude having an exponential decay time.

12. The current pulse generator of claim 11, wherein said energy storage network further comprises:
a first resistor, of approximately 100 kilohms to 10 megohms, connected between said second capacitor second terminal and said energy storage network input connection; and
a second resistor, of approximately 50 ohms, connected between said transmission line second end and both of said second capacitor second terminal and said energy storage input connection.

13. The current pulse generator of claim 1, wherein said signal conductor of said electrical conduction path includes first and second transmission lines each having an input and an output terminal, said first transmission line input terminal connected to said first switch and said second transmission line output terminal connected to said CUT, and further comprising:
electrical test equipment;
a two position second switch connected between said first transmission line output terminal and the input terminal of said second transmission line and to said electrical test equipment and selectively operable in a first position to connect the output terminal of said first transmission line to the input terminal of said second transmission line and to decouple said electrical test equipment from said CUT and operable in a second position to connect said electrical test equipment to said CUT and to decouple the output terminal of said first transmission line from the input terminal of said second transmission line;

a controller operable to control said first switch, and said second switch in combination to perform the operations of:
i.) opening said first switch and setting said second switch to its first position;
ii.) closing said first switch while said second switch is in the first position, to cause said energy storage network to discharge and deliver a current pulse to said CUT through said electrical conduction path and said second switch; and
iii.) setting said second switch to its second position to substantially decouple said first switch from said CUT, and substantially couple said electrical test equipment to said CUT, to enable said electrical test equipment to perform testing of said CUT.

14. The current pulse generator of claim 13, wherein said electrical test equipment is a semiconductor parametric analyzer, or a curve tracer, or a vector volt meter, or a network analyzers, or a time domain reflectometer, or automated test equipment, or the like.

15. The current pulse generator of claim 1, further comprising:
a resistor, of resistance value approximately equal to the electrical conduction path impedance, connected between said CUT and said electrical conduction path ground.

16. The current pulse generator of claim 15, wherein the resistance value of said resistor is approximately 330 ohms.

17. The current pulse generator of claim 1, wherein said first one of said capacitors is approximately 60 to 120 picofarads, said second one of said capacitors is approximately 300 to 500 picofarads, and said transmission line is approximately 50 ohms impedance and has an end-to-end signal propagation time delay of approximately 15 nanoseconds;
and wherein said energy storage network further comprises:
a first resistor of between approximately 100 kilohms and 10 megohms connected between said second terminal of said second one of said capacitors and said energy storage network input connection; and
a second resistor of approximately 50 ohms connected between said second terminal of said second one of said capacitors and said transmission line second terminal.

18. The current pulse generator of claim 1, wherein said energy storage network further comprises a resistor connected between said second capacitor second terminal and said transmission line second terminal having a resistance that matches the impedance of said transmission line.

* * * * *